United States Patent
Lang

(10) Patent No.: US 9,916,126 B2
(45) Date of Patent: Mar. 13, 2018

(54) SMART AUDIO SETTINGS

(71) Applicant: Sonos, Inc., Santa Barbara, CA (US)

(72) Inventor: Jonathan P Lang, Santa Barbara, CA (US)

(73) Assignee: Sonos, Inc., Santa Barbara, CA (US)

(*) Notice: Subject to any disclaimer, the term of this patent is extended or adjusted under 35 U.S.C. 154(b) by 210 days.

(21) Appl. No.: 14/677,541

(22) Filed: Apr. 2, 2015

(65) Prior Publication Data

US 2015/0212788 A1  Jul. 30, 2015

Related U.S. Application Data

(63) Continuation of application No. 13/539,261, filed on Jun. 29, 2012, now Pat. No. 9,031,244.

(51) Int. Cl.
| | |
|---|---|
| *G06F 17/00* | (2006.01) |
| *H04R 29/00* | (2006.01) |
| *G06F 3/16* | (2006.01) |
| *H03G 3/30* | (2006.01) |
| *H03G 5/00* | (2006.01) |
| *H03G 5/16* | (2006.01) |

(Continued)

(52) U.S. Cl.
CPC ............ *G06F 3/165* (2013.01); *G05B 15/02* (2013.01); *H03G 3/3089* (2013.01); *H03G 5/005* (2013.01); *H03G 5/165* (2013.01); *G06F 17/30743* (2013.01)

(58) Field of Classification Search
CPC ............... G06F 17/00; G06F 17/3074; G06F 17/30743; G06F 3/165; H04S 7/307; H03G 5/005; H03G 5/025; H03G 5/165; H03G 3/3089
USPC ....... 700/94; 715/716; 381/101–103, 56, 58; 84/601, 604, 608, 609
See application file for complete search history.

(56) References Cited

U.S. PATENT DOCUMENTS

| | | |
|---|---|---|
| 5,440,644 A | 8/1995 | Farinelli et al. |
| 5,761,320 A | 6/1998 | Farinelli et al. |

(Continued)

FOREIGN PATENT DOCUMENTS

| | | |
|---|---|---|
| EP | 1389853 A1 | 2/2004 |
| EP | 2194471 A1 | 6/2010 |

(Continued)

OTHER PUBLICATIONS

"Notice of Allowance dated Jan. 16, 2015, issued in connection with U.S. Appl. No. 13/539,261, filed Jun. 29, 2012, 5 pages."

(Continued)

*Primary Examiner* — Xu Mei
(74) *Attorney, Agent, or Firm* — McDonnell Boehnen Hulbert & Berghoff LLP

(57) ABSTRACT

Embodiments described herein provide for smart configuration of audio settings for a playback device. According to an embodiment, while a playback device is a part of a first zone group that includes the playback device and at least one first playback device, the playback device applies a first audio setting. The embodiment also includes the playback device joining a second zone group that includes the playback device and at least one second playback device. The embodiment further includes the playback device applying a second audio setting based on an audio content profile corresponding to the second zone group.

20 Claims, 11 Drawing Sheets

(51) Int. Cl.
*G05B 15/02* (2006.01)
*G06F 17/30* (2006.01)

(56) References Cited

U.S. PATENT DOCUMENTS

| | | |
|---|---|---|
| 5,923,902 A | 7/1999 | Inagaki |
| 6,032,202 A | 2/2000 | Lea et al. |
| 6,256,554 B1 | 7/2001 | DiLorenzo |
| 6,404,811 B1 | 6/2002 | Cvetko et al. |
| 6,469,633 B1 | 10/2002 | Wachter |
| 6,522,886 B1 | 2/2003 | Youngs et al. |
| 6,611,537 B1 | 8/2003 | Edens et al. |
| 6,631,410 B1 | 10/2003 | Kowalski et al. |
| 6,643,744 B1 | 11/2003 | Cheng |
| 6,757,517 B2 | 6/2004 | Chang |
| 6,778,869 B2 | 8/2004 | Champion |
| 6,985,694 B1 | 1/2006 | De Bonet et al. |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,773 B2 | 6/2007 | Thomas |
| 7,295,548 B2 | 11/2007 | Blank et al. |
| 7,312,785 B2 | 12/2007 | Tsuk et al. |
| 7,483,538 B2 | 1/2009 | McCarty et al. |
| 7,571,014 B1 | 8/2009 | Lambourne et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,689,305 B2 | 3/2010 | Kreifeldt et al. |
| 7,742,740 B2 | 6/2010 | Goldberg et al. |
| 7,835,689 B2 | 11/2010 | Goldberg et al. |
| 7,853,341 B2 | 12/2010 | McCarty et al. |
| 7,949,707 B2 | 5/2011 | McDowall et al. |
| 7,987,294 B2 | 7/2011 | Bryce et al. |
| 8,014,423 B2 | 9/2011 | Thaler et al. |
| 8,045,952 B2 | 10/2011 | Qureshey et al. |
| 8,050,652 B2 | 11/2011 | Qureshey et al. |
| 8,074,253 B1 | 12/2011 | Nathan |
| 8,103,009 B2 | 1/2012 | McCarty et al. |
| 8,234,395 B2 | 7/2012 | Millington |
| 8,332,414 B2 | 12/2012 | Nguyen et al. |
| 8,483,853 B1 | 7/2013 | Lambourne |
| 8,527,876 B2 | 9/2013 | Wood et al. |
| 8,989,406 B2 | 3/2015 | Wong et al. |
| 9,031,244 B2 * | 5/2015 | Lang .................. H03G 3/3089 381/56 |
| 9,329,831 B1 * | 5/2016 | Fullerton ................ G06F 3/165 |
| 9,363,601 B2 * | 6/2016 | Ramos .................... H04R 3/12 |
| 9,699,579 B2 * | 7/2017 | Carlsson ................. H04R 3/12 |
| 2001/0042107 A1 | 11/2001 | Palm |
| 2001/0043592 A1 | 11/2001 | Jimenez et al. |
| 2002/0022453 A1 | 2/2002 | Balog et al. |
| 2002/0026442 A1 | 2/2002 | Lipscomb et al. |
| 2002/0089529 A1 | 7/2002 | Robbin |
| 2002/0124097 A1 | 9/2002 | Isely et al. |
| 2003/0157951 A1 | 8/2003 | Hasty |
| 2004/0024478 A1 | 2/2004 | Hans et al. |
| 2005/0251273 A1 | 11/2005 | Bychowsky et al. |
| 2006/0008256 A1 | 1/2006 | Khedouri et al. |
| 2006/0026521 A1 | 2/2006 | Hotelling et al. |
| 2006/0195480 A1 | 8/2006 | Spiegelman et al. |
| 2006/0225097 A1 | 10/2006 | Lawrence-Apfelbaum |
| 2007/0064954 A1 | 3/2007 | Booth et al. |
| 2007/0142944 A1 | 6/2007 | Goldberg et al. |
| 2008/0002839 A1 | 1/2008 | Eng |
| 2008/0175411 A1 | 7/2008 | Greve |
| 2009/0047993 A1 | 2/2009 | Vasa |
| 2009/0063274 A1 | 3/2009 | Dublin, III et al. |
| 2011/0087842 A1 | 4/2011 | Lu et al. |
| 2011/0234480 A1 | 9/2011 | Fino et al. |
| 2012/0268145 A1 | 10/2012 | Chandra et al. |
| 2013/0202131 A1 | 8/2013 | Kemmochi et al. |
| 2014/0192986 A1 | 7/2014 | Lee et al. |
| 2014/0219483 A1 | 8/2014 | Hong |

FOREIGN PATENT DOCUMENTS

| | | |
|---|---|---|
| WO | 0153994 | 7/2001 |
| WO | 2003093950 A2 | 11/2003 |

OTHER PUBLICATIONS

"AudioTron Quick Start Guide, Version 1.0", Voyetra Turtle Beach, Inc., Mar. 2001, 24 pages.
"AudioTron Reference Manual, Version 3.0", Voyetra Turtle Beach, Inc., May 2002, 70 pages.
"AudioTron Setup Guide, Version 3.0", Voyetra Turtle Beach, Inc., May 2002, 38 pages.
"Bluetooth. "Specification of the Bluetooth System: The ad hoc SCATTERNET for affordable and highly functional wireless connectivity" Core, Version 1.0 A, Jul. 26, 1999, 1068 pages."
"Bluetooth. "Specification of the Bluetooth System: Wireless connections made easy" Core, Version 1.0 B, Dec. 1, 1999, 1076 pages."
"Dell, Inc. "Dell Digital Audio Receiver: Reference Guide" Jun. 2000, 70 pages."
"Dell, Inc. "Start Here" Jun. 2000, 2 pages."
Jo J., et al., "Synchronized One-to-many Media Streaming with Adaptive Playout Control," Proceedings of SPIE, 2002, vol. 4861, pp. 71-82.
"Jones, Stephen. "Dell Digital Audio Receiver: Digital upgrade for your analog stereo" Analog Stereo. Jun. 24, 2000 <http://www.reviewsonline.com/articles/961906864.htm> retrieved Jun. 18, 2014, 2 pages."
"Louderback, Jim. "Affordable Audio Receiver Furnishes Homes With MP3" TechTV Vault. Jun. 28, 2000 <http://www.g4tv.com/articles/17923/affordable-audio-receiver-furnishes-homes-with-mp3/> retrieved Jul. 10, 2014, 2 pages."
Microsoft; Corporation., "Using Microsoft Outlook 2003", Cambridge College, 2003.
Motorola., "Simplefi, Wireless Digital Audio Receiver, Installation and User Guide", Dec. 31, 2001.
"Non-Final Office Action dated Jul. 1, 2014, issued in connection with U.S. Appl. No. 13/539,261, filed Jun. 29, 2012, 9 pages."
"Palm, Inc. "Handbook for the Palm VII Handheld" May 2000, 311 pages."
"Presentations at WinHEC 2000" May 2000, 138 pages.
PRISMIQ; Inc., "PRISMIQ Media Player User Guide", 2003, 44 pages.
"UPnP; "Universal Plug and Play Device Architecture"; Jun. 8, 2000; version 1.0; Microsoft Corporation; pp. 1-54".
"Denon 2003-2004 Product Catalog," Denon, 2003-2004, 44 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2003, entitled "Controlling and manipulating groupings in a multi-zone music or media system," 82 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

SMART AUDIO SETTINGS

CROSS REFERENCE TO RELATED APPLICATIONS

This application claims priority under 35 U.S.C. § 120 to, and is a continuation of, U.S. non-provisional patent application Ser. No. 13/539,261, filed on Jun. 29, 2012, entitled "Smart Audio Settings," which is assigned to the assignee of the present application and is incorporated herein by reference.

FIELD OF THE DISCLOSURE

The disclosure is related to consumer goods and, more particularly, to systems, products, features, services, and other items directed to media playback or some aspect thereof.

BACKGROUND

Technological advancements have increased the accessibility of music content, as well as other types of media, such as television content, movies, and interactive content. For example, a user can access audio, video, or both audio and video content over the Internet through an online store, an Internet radio station, a music service, a movie service, and so on, in addition to the more traditional avenues of accessing audio and video content. Demand for audio, video, and both audio and video content inside and outside of the home continues to increase.

BRIEF DESCRIPTION OF THE DRAWINGS

Features, aspects, and advantages of the presently disclosed technology are better understood with regard to the following description, appended claims, and accompanying drawings where:

Figure 1:
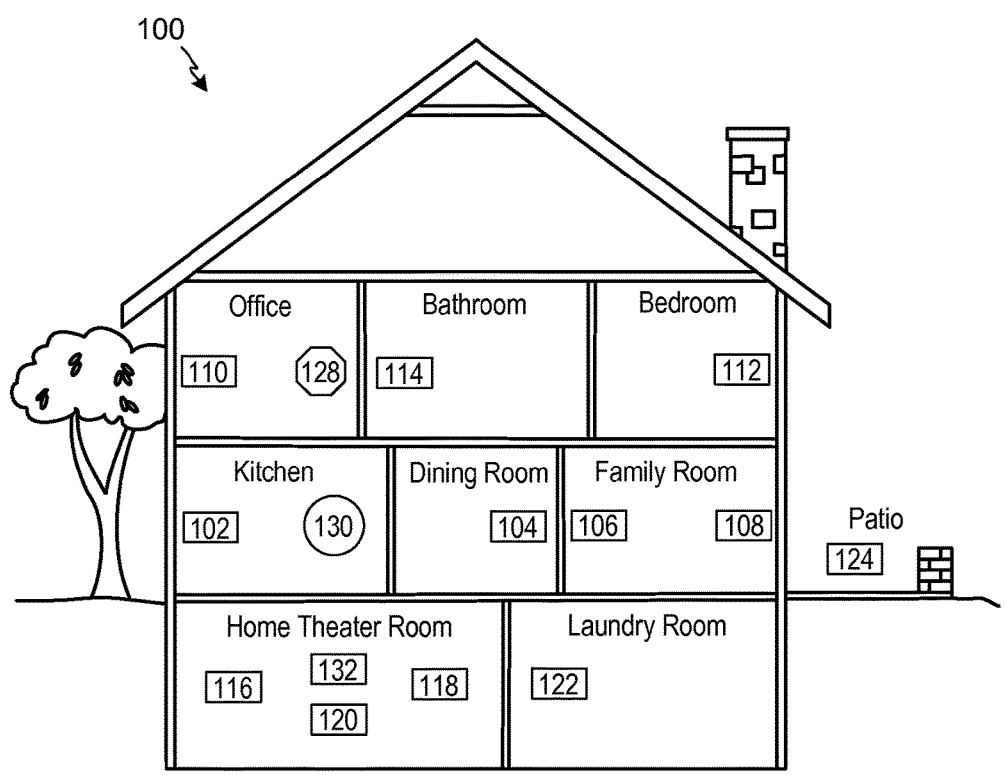
FIG. 1 shows an illustration of an example system in which embodiments of the methods and apparatus disclosed herein can be implemented.

In addition, the drawings are for the purpose of illustrating example embodiments, but it is understood that the present disclosure is not limited to the arrangements and instrumentality shown in the drawings.

DETAILED DESCRIPTION

I. Overview

Listening to audio content out loud can be a social activity that involves family, friends, or both. Audio content may include, for instance, music, talk radio, books, audio from television, and other audible material. For example, in a household, people may play music out loud at parties and other social gatherings. In such an environment, people may wish to play the music in one listening zone or multiple listening zones simultaneously, such that the music in each listening zone may be synchronized, without audible echoes or glitches. Such an experience may be further enriched when people, for example, browse audio sources, add a music track to a playback queue, learn more about a music track (such as track title or track artists), or view what music track is next in the playback queue.

Listening to audio content out loud can also be an individual experience. For example, an individual may play music out loud for themselves in the morning before work, in the evening during dinner, or at other times throughout the day at home, work, or on the road. For these individual experiences, the individual may choose to either use headphones or limit the out loud playback of audio content to a single zone or area.

Combining signal processing techniques with audio playback equipment that takes advantage of the signal processing can often enhance the listening experience. For example, multi-channel audio, when reproduced appropriately, can create an experience where sounds appear to be coming from sources placed throughout the listening room as the audio recording was originally intended. As the number of channels increase, the experience can be enhanced such that eventually you can get a three-dimensional effect. In another example, audio settings can be adjusted to enhance the listening experience. For example, the low- or high-frequency emphasis can be adjusted to satisfy a user's listening preference. In another example, the balance can be adjusted for the configuration of the playback device in the listening environment.

Example systems, methods, apparatus, and articles of manufacture disclosed and described herein provide for smart configuration of audio settings for a playback device. For example, when a user adjusts the audio settings of a playback device during the playback of a song or track, the user is warned if the currently playing song is "atypical" relative to other audio content. In some embodiments, an audio profile is determined for a plurality of songs to determine a "representative" profile. An audio profile can also be determined for the currently playing song (or about to be played song), and compared with the "representative" profile to determine if the currently playing song (or about to be played song) is similar (or substantially similar). If the currently playing song is "atypical" (e.g., the song does not fit the representative profile), then an indication is provided to the user. In some embodiments, the indication warns the user that he or she is changing an audio setting while listening to an "atypical" song or track. This warning is particularly useful when, for example, the user makes an audio adjustment to the system while listening to a song that is not representative of the type of music for which the new setting will most generally apply. For instance, a user might increase the system's bass level while listening to a song with little bass content, and thereafter experience annoyingly high bass levels (until it is changed by the user again).

Example systems, methods, apparatus, and articles of manufacture disclosed and described herein provide for smart configuration of audio settings for a playback device as audio content changes. For example, the audio settings for a playback device are dynamically adjusted based on an audio profile of the content as different songs or tracks are played. In some embodiments, an audio profile is determined for a plurality of songs to determine one or more "representative" profiles for the songs. As a song is played, or is prepared to play next, the audio profile is examined, or determined if it is not already determined, and the audio settings are adjusted for the audio profile so that the song is played with the appropriate settings.

Example systems, methods, apparatus, and articles of manufacture disclosed and described herein provide for smart configuration of audio settings for a playback device in a playback network with multiple devices. In some embodiments, when the audio settings are adjusted on a playback device, the settings are replicated to similar devices on the playback network.

Many other embodiments are provided and described herein.

II. An Example Operating Environment

Referring now to the drawings, in which like numerals can refer to like parts throughout the figures, FIG. 1 shows an example system 100 in which one or more embodiments disclosed herein can be practiced or implemented.

By way of illustration, system 100 represents a home presently configured with multiple zones, though the home could have been configured with only one zone. Each zone in the home, for example, may represent a different room or space, such as an office, bathroom, bedroom, kitchen, dining room, family room, home theater room, utility or laundry room, and patio. A single zone might also include multiple rooms if so configured. One or more of zone players 102-124 are shown in each respective zone of the home. A zone player 102-124, also referred to as a playback device, multimedia unit, speaker, player, and so on, provides audio, video, and/or audiovisual output. Controller 130 provides control to system 100. Controller 130 may be fixed to a zone, or alternatively, mobile such that it can be moved about the zones. System 100 may also include more than one controller 130. System 100 illustrates an example whole house audio system, though it is understood that the technology described herein is not limited to its particular place of application or to an expansive system like a whole house audio system 100 of FIG. 1.

a. Example Zone Players

Figure 2A:
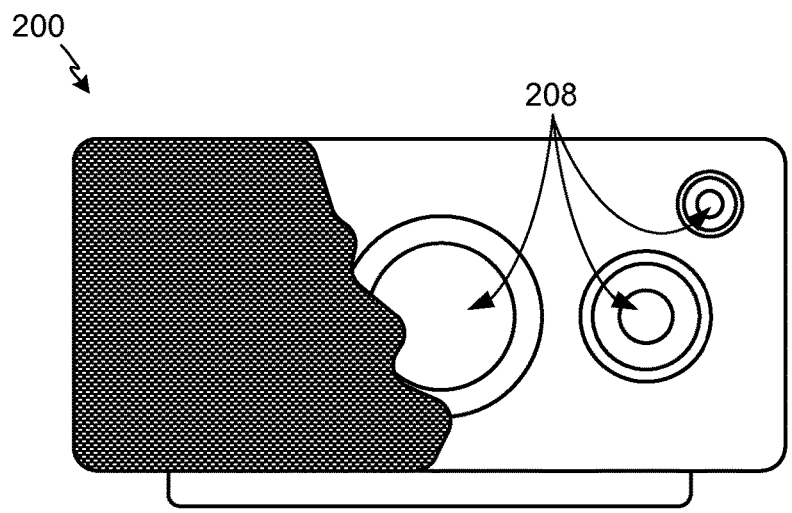
FIG. 2A shows an illustration of an example zone player having a built-in amplifier and speakers.
Figure 2B:
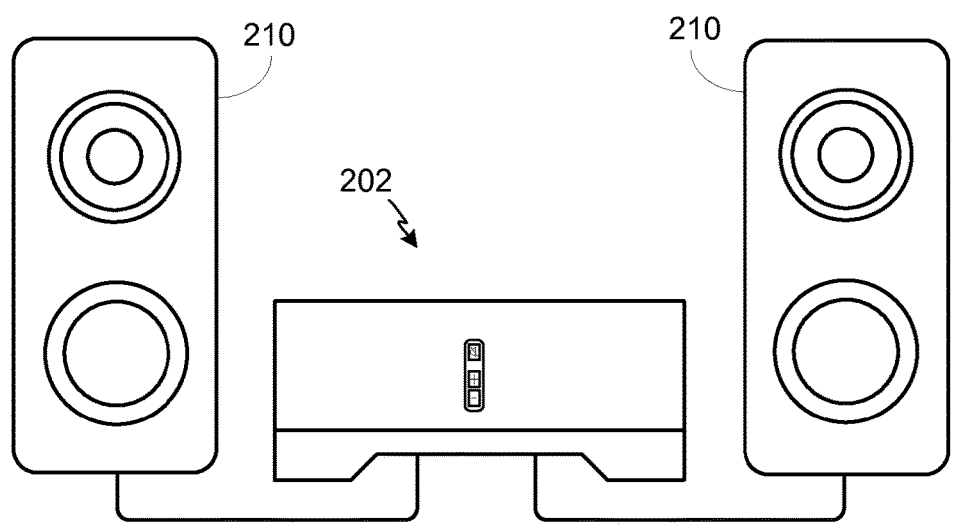
FIG. 2B shows an illustration of an example zone player having a built-in amplifier and connected to external speakers.
Figure 2C:
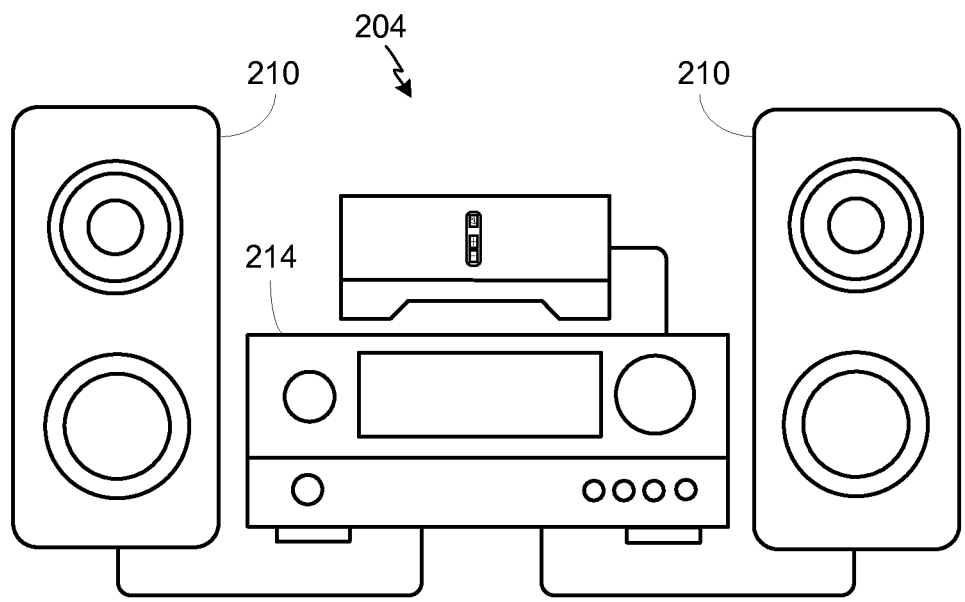
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more speakers. A built-in amplifier is described more below with respect to FIG. 4. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 is configured to reproduce a subset of full-range sound, such as when zone player 200 is grouped with other zone players to play stereophonic audio, monaural audio, and/or surround audio or when the audio content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a zone player may contain a playlist or queue of audio items to be played (also referred to herein as a "playback queue"). Each item in the queue may comprise a uniform resource identifier (URI) or some other identifier. The URI or identifier can point the zone player to the audio source. The source might be found on the Internet (e.g., the cloud), locally from another device over data network 128, the controller 130, stored on the zone player itself, or from an audio source communicating directly to the zone player. In some embodiments, the zone player can reproduce the audio itself, send it to another zone player for reproduction, or both where the audio is played by the zone player and one or more additional zone players in synchrony. In some embodiments, the zone player can play a first audio content (or not play at all), while sending a second, different audio content to another zone player(s) for reproduction.

By way of illustration, SONOS, Inc. of Santa Barbara, Calif. presently offers for sale zone players referred to as a "PLAY:5," "PLAY:3," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player might include a sound bar for television. In yet another example, a zone player can include or interact with a docking station for an Apple IPOD™ or similar device.

b. Example Controllers

Figure 3:
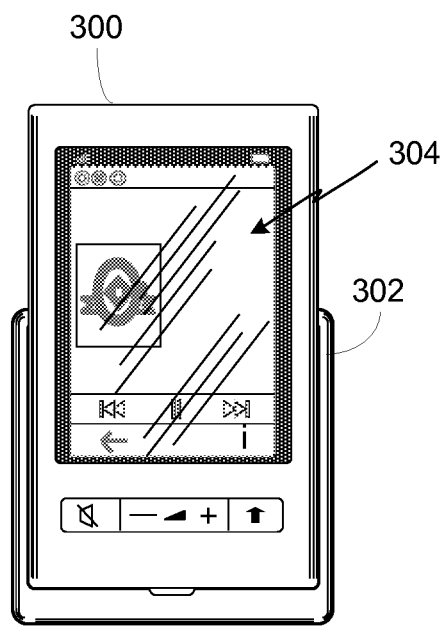
FIG. 3 shows an illustration of an example controller.

FIG. 3 illustrates an example wireless controller 300 in docking station 302. By way of illustration, controller 300 can correspond to controlling device 130 of FIG. 1. Docking station 302, if provided, may be used to charge a battery of controller 300. In some embodiments, controller 300 is provided with a touch screen 304 that allows a user to interact through touch with the controller 300, for example, to retrieve and navigate a playlist of audio items, control operations of one or more zone players, and provide overall control of the system configuration 100. In certain embodiments, any number of controllers can be used to control the system configuration 100. In some embodiments, there can be a limit set on the number of controllers that can control the system configuration 100. The controllers might be wireless like wireless controller 300 or wired to data network 128.

In some embodiments, if more than one controller is used in system 100, then each controller may be coordinated to display common content, and may all be dynamically updated to indicate changes made from a single controller. Coordination can occur, for instance, by a controller periodically requesting a state variable directly or indirectly from one or more zone players; the state variable may provide information about system 100, such as current zone group configuration, what is playing in one or more zones, volume levels, and other items of interest. The state variable may be passed around on data network 128 between zone players (and controllers, if so desired) as needed or as often as programmed.

In addition, an application running on any network-enabled portable device, such as an IPHONE™, IPAD™, ANDROID™ powered phone, or any other smart phone or network-enabled device can be used as controller 130. An application running on a laptop or desktop personal computer (PC) or Mac™ can also be used as controller 130. Such controllers may connect to system 100 through an interface with data network 128, a zone player, a wireless router, or using some other configured connection path. Example controllers offered by SONOS, Inc. of Santa Barbara, Calif. include a "Controller 200," "SONOS® CONTROL," "SONOS® Controller for iPhone," "SONOS® Controller for IPAD™," "SONOS® Controller for ANDROID™," "SONOS® Controller for MAC™ or PC."

c. Example Data Connection

Zone players 102 to 124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players 102-124 are wirelessly coupled to data network 128 using a non-mesh topology. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a secure, AES-encrypted, peer-to-peer wireless mesh network. Alternatively, in certain embodiments, the data network 128 is the same network, such as a traditional wired or wireless network, used for other applications in the household.

d. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, if a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players (also referred to as "bonded zone players") can play audio in synchrony with other zone players in the same or different zones.

In some embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device can be set in a consolidated mode, for example.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

e. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly (or substantially seamlessly) listening to the audio. Further, zones can be put into a "party mode" such that all associated zones will play audio in synchrony.

Sources of audio content to be played by zone players 102-124 are numerous. In some embodiments, music on a zone player itself may be accessed and a played. In some embodiments, music from a personal library stored on a computer or networked-attached storage (NAS) may be accessed via the data network 128 and played. In some embodiments, Internet radio stations, shows, and podcasts can be accessed via the data network 128. Music or cloud services that let a user stream and/or download music and audio content can be accessed via the data network 128. Further, music can be obtained from traditional sources, such as a turntable or CD player, via a line-in connection to a zone player, for example. Audio content can also be accessed using a different protocol, such as AIRPLAY™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 can be shared with any of the zone players 102-124 in the audio system 100.

III. Zone Players

Figure 4:
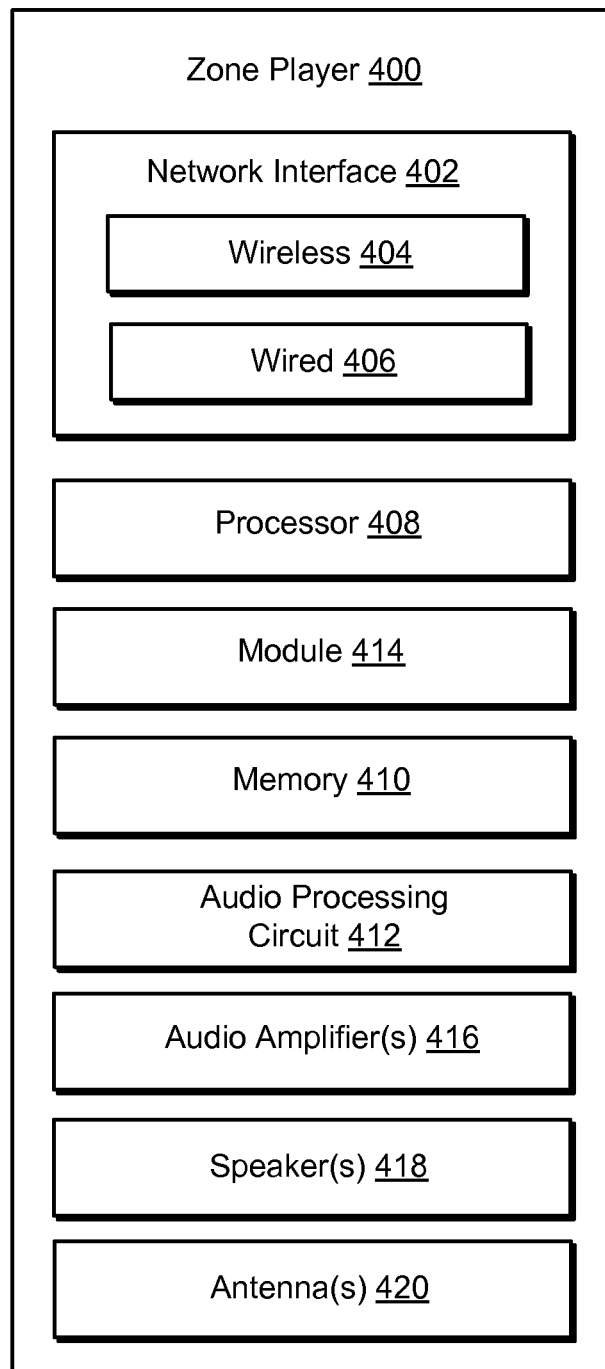
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, and a speaker unit 418 coupled to the audio amplifier 416. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, network interface 402 can include one or both of a wireless interface 404 and a wired interface 406. The wireless interface 404, also referred to as a radio frequency (RF) interface, provides network interface functions for the zone player 400 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, or 802.15). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a uniform resource locator (URL) or some other identifier). In some embodiments, a task may be for the zone player 400 to send audio data to another zone player or device on a network. In some embodiments, a task may be for the zone player 400 to synchronize playback of audio with one or more additional zone players. In some embodiments, a task may be to pair the zone player 400 with one or more zone players to create a multi-channel audio environment. Additional or alternative tasks can be achieved via the one or more software module(s) 414 and the processor 408.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for play back through speakers 418. In addition, the audio processing component 412 can include circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5, is a zone player with a built-in amplifier and speakers that is capable of retrieving audio directly from the source, such as on the Internet or on the local network, for example. In particular, the PLAY:5 is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies, but from different channels of audio. Audio from Internet radio stations, online music and video services, downloaded music, analog audio inputs, television, DVD, and so on, can be played from the PLAY:5.

IV. Controller

Figure 5:
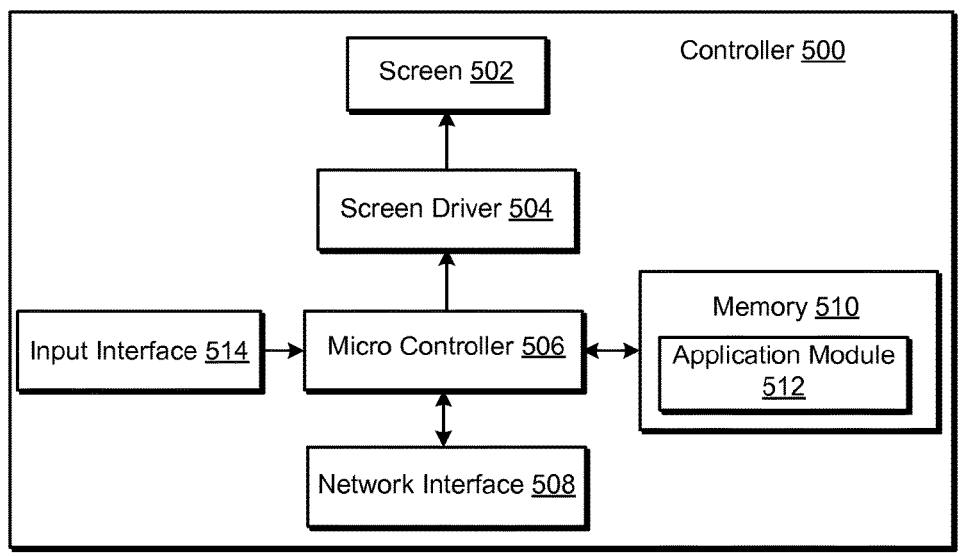
FIG. 5 shows an internal functional block diagram of an example controller.

Referring now to FIG. 5, there is shown an example block diagram for controller 500, which can correspond to the controlling device 130 in FIG. 1. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards including IEEE 802.11a, 802.11b 802.11g, 802.11n, or 802.15, and so on). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group and synchronizing the zone players for audio play back. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system, and each controller may share common information with another controller, or retrieve the common information from a zone player, if such a zone player stores configuration data (e.g., such as a state variable). Further, a controller can be integrated into a zone player.

It should be noted that other network-enabled devices such as an IPHONE®, IPAD® or any other smart phone or network-enabled device (e.g., a networked computer such as a PC or Mac®) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group play back an identical audio source or a list of identical audio sources in a synchronized manner such that no (or substantially no) audible delays or hiccups are to be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would manually and individually link each zone. The single command may include a mouse click, a double mouse click, a button press, a gesture, or some other programmed action. Other kinds of zone scenes can be programmed.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Example Ad-Hoc Network

Figure 6:
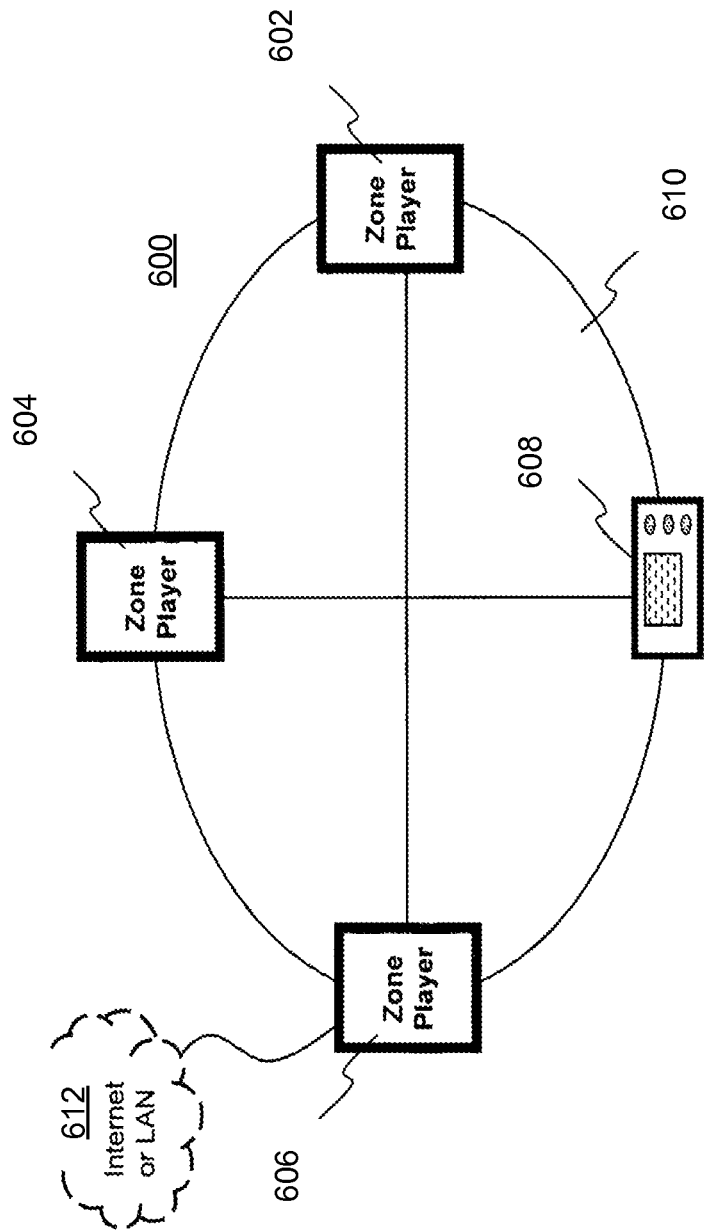
FIG. 6 shows an example ad-hoc playback network.

Certain particular examples are now provided in connection with FIG. 6 to describe, for purposes of illustration, certain systems and methods to provide and facilitate connection to a playback network. FIG. 6 shows that there are three zone players 602, 604 and 606 and a controller 608 that form a network branch that is also referred to as an Ad-Hoc network 610. The network 610 may be wireless, wired, or a combination of wired and wireless. In general, an Ad-Hoc (or "spontaneous") network is a local area network or other small network in which there is generally no one access point for all traffic. With an established Ad-Hoc network 610, the devices 602, 604, 606 and 608 can all communicate with each other in a "peer-to-peer" style of communication, for example. Furthermore, devices may come/and go from the network 610, and the network 610 will automatically reconfigure itself without needing the user to reconfigure the network 610. While an Ad-Hoc network is referenced in FIG. 6, it is understood that a playback network may be based on other types of networks as well.

Using the Ad-Hoc network 610, the devices 602, 604, 606, and 608 can share or exchange one or more audio sources and be dynamically grouped to play the same or different audio sources. For example, the devices 602 and 604 are grouped to playback one piece of music, and at the same time, the device 606 plays back another piece of music. In other words, the devices 602, 604, 606 and 608, as shown in FIG. 6, form a HOUSEHOLD that distributes audio and/or reproduces sound. As used herein, the term HOUSEHOLD (provided in uppercase letters to disambiguate from the user's domicile) is used to represent a collection of networked devices that are cooperating to provide an application or service. An instance of a HOUSEHOLD is identified with a household 610 (or household identifier), though a HOUSEHOLD may be identified with a different area or place.

In certain embodiments, a household identifier (HHID) is a short string or an identifier that is computer-generated to help ensure that it is unique. Accordingly, the network 610 can be characterized by a unique HHID and a unique set of configuration variables or parameters, such as channels (e.g., respective frequency bands), SSID (a sequence of alphanumeric characters as a name of a wireless network), and WEP keys (wired equivalent privacy or other security keys). In certain embodiments, SSID is set to be the same as HHID.

In certain embodiments, each HOUSEHOLD includes two types of network nodes: a control point (CP) and a zone player (ZP). The control point controls an overall network setup process and sequencing, including an automatic generation of required network parameters (e.g., WEP keys). In an embodiment, the CP also provides the user with a HOUSEHOLD configuration user interface. The CP function can be provided by a computer running a CP application module, or by a handheld controller (e.g., the controller 308) also running a CP application module, for example. The zone player is any other device on the network that is placed to participate in the automatic configuration process. The ZP, as a notation used herein, includes the controller 308 or a computing device, for example. In some embodiments, the functionality, or certain parts of the functionality, in both the CP and the ZP are combined at a single node (e.g., a ZP contains a CP or vice-versa).

In certain embodiments, configuration of a HOUSEHOLD involves multiple CPs and ZPs that rendezvous and establish a known configuration such that they can use a standard networking protocol (e.g., IP over Wired or Wireless Ethernet) for communication. In an embodiment, two types of networks/protocols are employed: Ethernet 802.3 and Wireless 802.11g. Interconnections between a CP and a ZP can use either of the networks/protocols. A device in the system as a member of a HOUSEHOLD can connect to both networks simultaneously.

In an environment that has both networks in use, it is assumed that at least one device in a system is connected to both as a bridging device, thus providing bridging services between wired/wireless networks for others. The zone player 606 in FIG. 6 is shown to be connected to both networks, for example. The connectivity to the network 612 is based on Ethernet and/or Wireless, while the connectivity to other devices 602, 604 and 608 is based on Wireless and Ethernet if so desired.

It is understood, however, that in some embodiments each zone player 606, 604, 602 may access the Internet when retrieving media from the cloud (e.g., Internet) via the bridging device. For example, zone player 602 may contain a uniform resource locator (URL) that specifies an address to a particular audio track in the cloud. Using the URL, the zone player 602 may retrieve the audio track from the cloud, and ultimately play the audio out of one or more zone players.

VI. Example System Configuration

Figure 7:
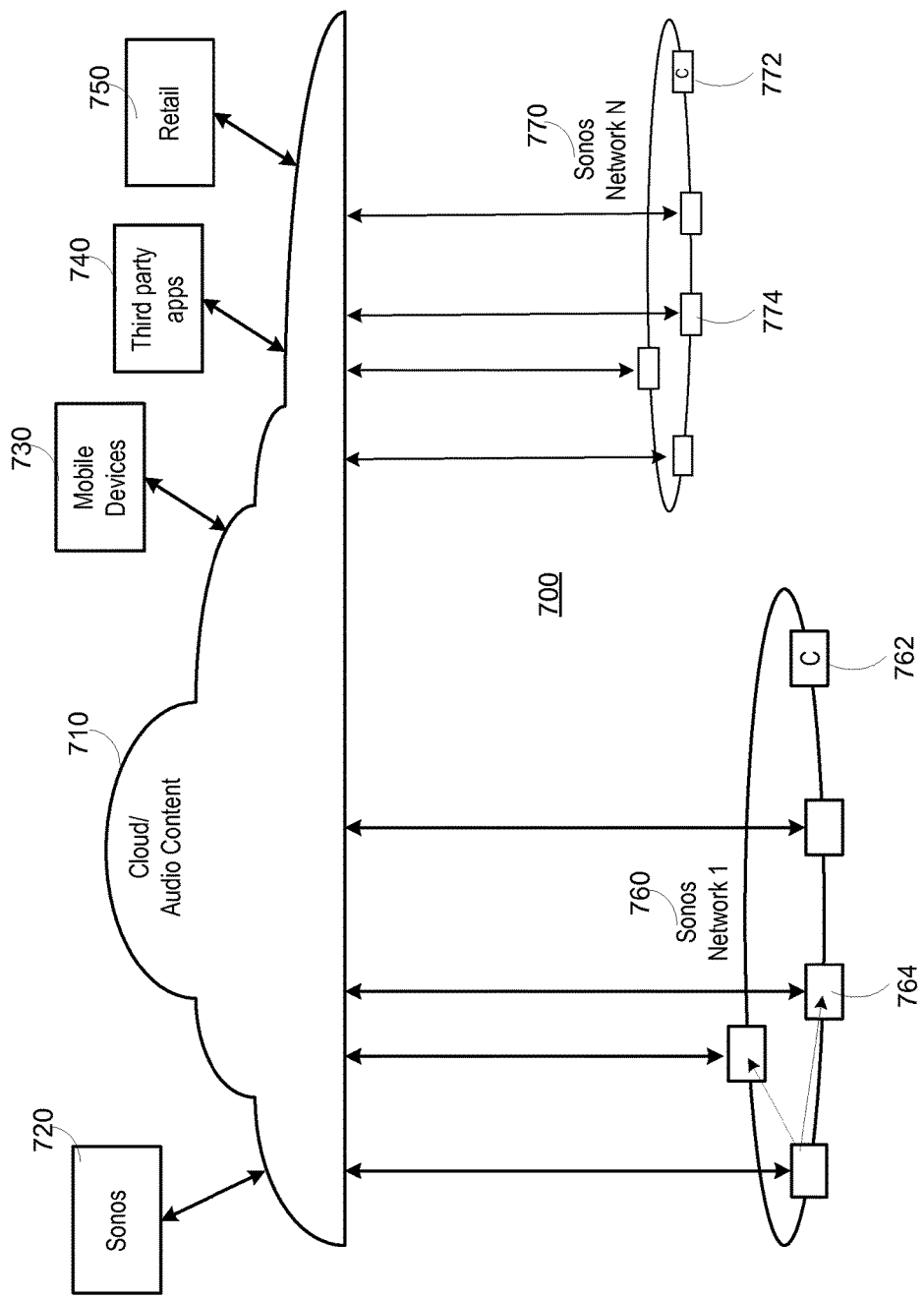
FIG. 7 shows a system including a plurality of networks including a cloud-based network and at least one local playback network.

FIG. 7 shows a system including a plurality of networks including a cloud-based network and at least one local playback network. A local playback network includes a plurality of playback devices or players, though it is understood that the playback network may contain only one playback device. In certain embodiments, each player has an ability to retrieve its content for playback. Control and content retrieval can be distributed or centralized, for example. Input can include streaming content provider input, third party application input, mobile device input, user input, and/or other playback network input into the cloud for local distribution and playback.

As illustrated by the example system 700 of FIG. 7, a plurality of content providers 720-750 can be connected to one or more local playback networks 760-770 via a cloud and/or other network 710. Using the cloud 710, a multimedia playback system 720 (e.g., Sonos™), a mobile device 730, a third party application 740, a content provider 750 and so on can provide multimedia content (requested or otherwise) to local playback networks 760, 770. Within each local playback network 760, 770, a controller 762, 772 and a playback device 764, 774 can be used to playback audio content.

VII. Smart Audio Settings

In an example system such as the one shown in FIG. 1, 6 or 7, where a SONOS system, for example, including one or more playback devices and one or more controllers, is connected together in a local area network (LAN), the ability to warn a user if he or she is adjusting the audio settings on a playback device while listening to a song with "atypical" spectral content may be valuable. Further, it may be valuable to create an "audio profile," assign audio settings to a playback device corresponding to the "audio profile," and automatically adjust the audio settings of a playback device based on the "audio profile." The "audio profile" may be determined based on a number of factors, such as described below. Replicating audio settings or changes to audio settings to similar playback devices on a playback network may also be valuable.

A. Players and Grouped Players

In the example system, audio playback is done using one or more playback devices, also referred to as players or zone players. In some embodiments, the example system includes the capability to group multiple players together to play audio in a synchronized fashion such that all of the players play back audio from an (e.g., identical) audio source or a list of audio sources in a synchronized manner such that no (or substantially no) audible delays or hiccups can be heard. Examples of grouped players include a zone group (when two or more zones are grouped), zone scenes (when a zone or zone group is formed based upon a trigger), bonded zone (often further distinguished as a zone having two or more players, a "paired player," or "consolidated player"), and so on. In certain embodiments, players can be grouped and ungrouped dynamically, preferably through a control interface, such as a wireless controller, and not be physically connecting and re-connecting speaker wire, for example, to individual, discrete speakers to create different groupings. Grouped players can be further be grouped with other players and or zone groups to create yet another (i.e., nested) group of players.

In some embodiments, when a group of players is created or when a player is added to a zone group, such as by user command(s) input through a controller, the player(s) of the grouped zone can each store an updated state variable that indicates the players that are included in the grouped zone. In some embodiments, a player knows it is in a zone group based on the state variable stored in memory at the player, for example. In some embodiments, the controller(s) in the system identify a player is in a grouped zone by querying a player in the grouped zone for the state variable. The controllers may use this information to display on a display screen that a player is grouped in a zone. In other embodiments, the state variable is stored at a master player, in the controller, or some other accessible location.

B. Audio Settings

In some embodiments, audio settings on a playback device can be adjusted to customize the listening experience through a particular playback device. For example, the "bass" setting can be used to adjust the low frequency emphasis (gain) of the audio playback. The low frequency adjustments can apply to frequencies below a cutoff frequency and can follow, for example, a logarithmic response such as +/−0.5 dB increments, where unaltered audio may be set to 0 dB. In another example, the "treble" setting can be used to adjust the high frequency emphasis (gain) of the audio playback. Similar to the bass adjustments, the high frequency adjustments can apply to frequencies above a cutoff frequency and can follow, for example, a logarithmic response. In another example, the "balance" can be used to adjust the emphasis between the left and right channel, when two-channel audio is played. The balance adjustments can follow, for example, a linear or non-linear (e.g., logarithmic) response such that increasing the balance can correspond to more emphasis on the left channel, and decreasing the balance can correspond to more emphasis on the right channel. In yet another example, the "loudness" setting can be used to adjust the audio emphasis across the frequency range to account for human auditory system response as loudness changes. Other examples of audio settings may be considered.

In the example system, audio settings can apply to a single player or multiple players in a system. In one example, the audio settings can apply to a group of players that are joined together to play audio in a synchronized fashion (e.g., zone group, zone scene, bonded zone, and so on). In one embodiment, the audio settings for the players in a group are determined by replicating the audio settings from a single player to other players in the group. This may happen, for example, when the group is formed, when a new player is added to the group, and/or if the settings change on the player over time. For example, if the bass audio setting is adjusted on a first player such that the bass emphasis is increased by 1 dB, then the same increase (e.g., 1 dB) is replicated on all players (or a subset of players) in the group. In some embodiments, the audio settings are only replicated on similar players in the group. For example, audio settings on a SONOS™ PLAY:3 device may be replicated on other PLAY:3 devices and not on SONOS™ CONNECT devices.

In another example, the audio settings can apply to multiple players in a system even if the players are not grouped together to play audio in synchronized fashion. In one example embodiment, the audio settings for a player are replicated to all players (or a subset of players) in the system. This may be done to minimize user configuration when setting up and/or changing the audio settings in a multi-player system. For example, if the audio settings are adjusted on a PLAY:3 device in a playback network, then the audio settings can be automatically replicated to all PLAY:3 devices on the playback network.

In another embodiment, the audio settings applied to multiple playback devices are determined by a combination of replicating audio settings and setting individual settings. For example, the audio settings of a player may be replicated on similar players in the group, and different players may set their audio settings differently. For example, if a zone group consists of two PLAY:3 devices and one CONNECT device, then the audio settings from one PLAY:3 device could be replicated to the second PLAY:3 device but not the CONNECT device. In another example, if a household consists of multiple PLAY:3 devices, then the audio settings from one PLAY:3 device could be replicated on some of the PLAY:3 devices, but not all. This may be desirable because of the acoustic differences among different listening zones in the household.

C. Data Processing

Audio equalization can be done using signal processing algorithms (e.g., digital signal processing or DSP algorithms) using a general-purpose processor or a dedicated audio processing module (e.g., DSP chip or audio codec with processing capabilities).

In one embodiment, the full audio stream is sent to each player of a grouped zone (e.g., zone group, zone scene, bonded zone), and each player is then responsible for its own signal processing based on the channel and/or audio equalization they are responsible to play. For example, in a 2.1 configuration where two full-frequency players are grouped with a subwoofer, each player may receive the full frequency spectrum audio stream and remove (i.e., filter out) the audio frequency spectrum (above or below the crossover) that they are not responsible to play. In this example configuration, the audio settings (e.g., bass, treble, balance, loudness, and so on) can be set at each player of the grouped zone, and each player adjusts the audio playback accordingly.

In another embodiment, one player (e.g., primary player) performs the signal processing, and sends to each secondary device, the (e.g., filtered) audio they are responsible to play. Following the above example of a 2.1 configuration, where now the left full-frequency player is the primary player and is responsible to receive the full audio stream and separate the left and right channels as well as the low-frequency audio for playback by the secondary players (e.g., the right full-frequency player and the subwoofer). The primary player sends the right channel audio to the right full-frequency player for playback, and the low frequency audio to the subwoofer for playback. In this example configuration, the audio settings (e.g., bass, treble, balance, loudness, and so on) can be adjusted at the primary player and the adjusted audio signals are sent to the secondary players.

In yet another example embodiment, a combination of the two models mentioned above can be implemented. For example, the primary player does some preliminary signal processing before sending to each secondary player, the (e.g., filtered) audio they are responsible to play. Once the secondary player receives the audio, it completes the audio processing for playback. For example, the primary player may send the right channel audio to the right full-frequency player for playback, and the low frequency audio to the subwoofer for playback, but may rely on the secondary players to set the audio settings.

D. Audio Profiles

In some embodiments, an audio profile is determined by examining the spectral content of audio (e.g., music track). For example, an audio profile can be determined by examining the amount of content in each frequency band such that the combined frequency bands provide continuous coverage over the audible frequency range. For example, the frequency range of 20 Hz-20,000 Hz may be divided up as follows: band 1=20 Hz-150 Hz; band 2=150 Hz-2000 Hz; band 3=2000 Hz-5,000 Hz; band 4=5,000 Hz-12,000 Hz; and band 5=12,000 Hz-20,000 Hz. In some embodiments, an audio profile can be created for an individual song or track, or a group or collection of songs or tracks. For example, an audio profile can be created for the U2 song Elevation and/or all of the songs on the U2 album All That You Can't Leave Behind.

In one example embodiment, an audio profile is created by partitioning a song or track into time intervals, where each interval corresponds to, for example, an equal period of time. In one example, the song or track is partitioned into 10 sec. intervals. The partitioning of the song or track can be done, for example, "one the fly" (e.g., for streaming audio), or it can be done by retrieving the song or track, or portions thereof, for analysis. Once the song or track is partitioned into intervals, the Fourier Transform is done on the audio partition to determine the frequency content (magnitude and frequency) of the audio for that partition. The frequency content can be further aggregated into frequency bands corresponding to frequencies of interest, and the relative content per frequency band can be calculated. For example, the frequency content may be collected into the 5 frequency bands shown above. Furthermore the percent content per bin can be determined. For example, 20% in band 1, 30% in band 2, 35% in band 3, 10% in band 4, and 5% in band 5. The audio profile for each song can be determined, for example, by summing the results for each interval to create an aggregate result for the entire song. Similarly, the audio profile for a collection of songs can be determined, for example, by summing the results for each song to create an aggregate result for the collection of songs. Note that this is just one example of how an audio profile can be created, and many other methods can be used to create an audio profile.

In some embodiments, an audio profile is determined by examining other (or additional) attributes of audio. These attributes can be combined using algorithms to determine an audio profile. For example, an audio profile can be determined using the attributes and algorithms used by, for example, PANDORA™.

As suggested above, an audio profile can be created for a group or collection of songs or tracks. In some embodiments, an audio profile is created for a user of the example audio system such that the profile is generated using, for example, the songs or tracks in the user's music library, songs or tracks that are streamed by the user from an online audio service, and so on. In some embodiments, an audio profile is created per genre for a user of the example audio system. The genre may be determined, for example, by the metadata tags of the songs or tracks. For example, an audio profile can be created for each of the "Reggae," "Hip-Hop," and "Pop" genres. In some embodiments, an audio profile is created over an interval of use (e.g., time interval, recently played songs or tracks, and so on). For example, an audio profile may be determined based on the content that is played over the last ten (10) days, or possibly the last fifty (50) tracks that were played. In some embodiments, an audio profile is created for a combination of the above configurations. Other examples follow.

Audio profiles can be generated to determine a "representative" profile. A "representative" profile may apply, for example, to a specific user across all (or substantially all) of their music, to a system across all (or substantially all) music that is played over the system (a system may include a subset of players or all of the players on a playback network), to a specific player or zone, to a genre for a single user or a collection of users, and so on. For example, a "representative" profile for "Reggae" music in Jonathan's library can be determined by averaging the audio profiles over all of the songs in Jonathan's music library that are classified as part of the "Reggae" genre. Similarly, for example, a "representative" profile for a user can be determined by averaging the audio profiles over the user's library. As will be discussed below, the "representative" profile can be used to apply smart audio settings, and even determine when a song is played that does not follow the "representative" profile, such that a user is warned if they try to adjust the audio settings for a player while such a song is played.

In some example embodiments, a user using a user interface (UI) may configure what a profile is representative of. For example, the user may be given a selection of genres representing their music library. The user may, for example, determine that audio profiles are representative of individual genres (e.g., Rock, Reggae, Hip-Hop, and so on), a group of genres (e.g., music genres, spoken word genres, and so on), or all of the combined genres (e.g., all the audio content). In another example, the user may be given a selection of audio sources available on their playback network. The user may, for example, determine the audio profiles are representative of local music, streaming internet radio, local TV/Video, and so on.

E. Smart Audio Settings

In an example system, audio profiles are used to provide smart audio settings for a playback device or group of playback devices in a playback system. In some embodiments, smart audio settings are used when users initiate an audio settings adjustment on a playback device. For example, if a user initiates an audio setting adjustment via a controller (such as controllers 300, 500 in FIGS. 3 and 5, respectively) and/or a playback device (for example, a playback device with user interface (UI) control), a system module uses audio profiles to determine if the setting is being adjusted based on a "representative" song or track; and if not, a system module advises the user accordingly. The system modules can be part of the controller, the playback device, and/or another device on the LAN or in the "cloud." In some embodiments, smart audio settings are used to automatically adjust the audio settings without user input. For example, the system can automatically adjust the audio settings for a song or track, based on the audio profile of that song or track and the associated audio settings.

User-Initiated Audio Setting Adjustment

In some embodiments a user adjusts the audio settings based on the current song or track they are listening to, and these settings are applied to all music played over the playback device(s). In other embodiments, these settings are applied only to similar music that is played over the playback device(s).

In some embodiments, "representative profiles" are used to determine if a setting adjustment is being made based on a "representative" song or track. In one example embodiment, an audio profile is determined for the current song or track and compared to the "representative profile" to determine if the current song is similar (or substantially similar) to the "representative" song or track. In some instances, the "representative profile" is based on songs or tracks from the same genre, while in other instances, the "representative profile" is based on the entire music collection, and so on.

In an example embodiment, if the audio profile of the current song or track is determined to be similar (or substantially similar) to the "representative profile," then the audio adjustment proceeds normally and the settings are adjusted on the player(s). If, however, the audio profile of the current song or track is determined to be "atypical," (e.g., does not fit the "representative profile") then the user is advised accordingly, for example. In one example, this is done via a message displayed on a display screen of a controller (e.g., the controller 500). In an embodiment, the message is generated at the playback device and is sent over a network from the playback device to the controller, where the message is displayed to the user.

In some embodiments a system starts with no "representative profiles" (or one or a few "representative profiles"), and builds "representative profiles" based on analyzing audio in the system (e.g., the audio on the local music library, the audio from streaming services or Internet radio, and so on). As "representative profiles" are built, the audio is classified by "representative profile" and audio settings adjustments can be applied to each "representative profile". As new songs are analyzed, they are grouped into an existing "representative profile" if they are similar (or substantially similar). If, however, the new song does not fit into an existing "representative profile", a new "representative profile" is created. The newly created "representative profile" may be stored in memory on any of a playback device, a controller, and another network connected device.

In one example of smart audio settings for user-initiated audio setting adjustment, a user decides to increase the bass setting on a playback device while listening to a song that has very little low-frequency audio content. In this example, the system is configured with a "representative profile" that is based on the music in the user's local music library. As the user adjusts the bass on the audio setting, a module on the playback device, for example, determines an audio profile of the song (if an audio profile has not already been determined; which may be tagged to the song as metadata). The audio profile of the song is compared to the "representative profile" to determine if the song has an audio profile that is representative of the user's music. In this example, the audio profile of the song is not representative of the user's music. In one embodiment, a notification or warning is given to the user that the song currently being played has an atypical amount of bass content in it compared to the music in the user's library. In another embodiment, the user is given the choice if they want to continue to adjust the bass settings for the player. In yet another embodiment, the user is given the choice if they want to save the new setting to the "representative profile."

Automatic Audio Setting Adjustment

In an example embodiment, "representative profiles" are used to automatically adjust the audio settings based on the audio profile of the song or track being played. In one example, the "representative profiles" are assigned the genre. For example, once the genre of the song or track is identified (e.g., using the associated metadata for the song or track), the audio settings corresponding to that genre (if available) are used to adjust the settings of the playback device. In one example, the audio settings can be determined for each genre by the user adjusting the settings based on listening to songs from that genre. In another example, the audio settings can be determined for each genre by the user adjusting the settings based on listening to a "representative" song from that genre. The "representative" song may be from the user's music library (e.g., local library or cloud-based library), or the song may be stored on a cloud server (e.g., the Sonos cloud server 720 in FIG. 7) and provided to the local playback network for calibration purposes. In another example, the audio settings can be determined for each genre remotely and provided to the local playback network. For example, a cloud server (e.g., the Sonos server 720 in FIG. 7) may determine default audio settings for each playback device and genre combination, and provide this information to the local network to apply to the playback devices.

However, the genre of a song or track may be determined by several factors, not necessarily including the frequency content. This can be addressed by creating a "representative profile" database over a collection of songs or tracks. In an embodiment, the "representative profile" database can be stored on a cloud server (e.g., the Sonos server 720 in FIG. 7), and provided to the local network to apply to the playback devices. The "representative profile" database can be continually updated by the devices in the local networks as they profile the audio that is played. Further, the audio settings for each "representative profile" can also be collected, aggregated, and stored by a cloud server. It may also be valuable to capture the amount of times the audio settings are changed on a local playback device for each "representative profile". This can indicate the confidence or stability of the audio settings for such a "representative profile".

F. Example Smart Audio Settings Method

Figure 8:
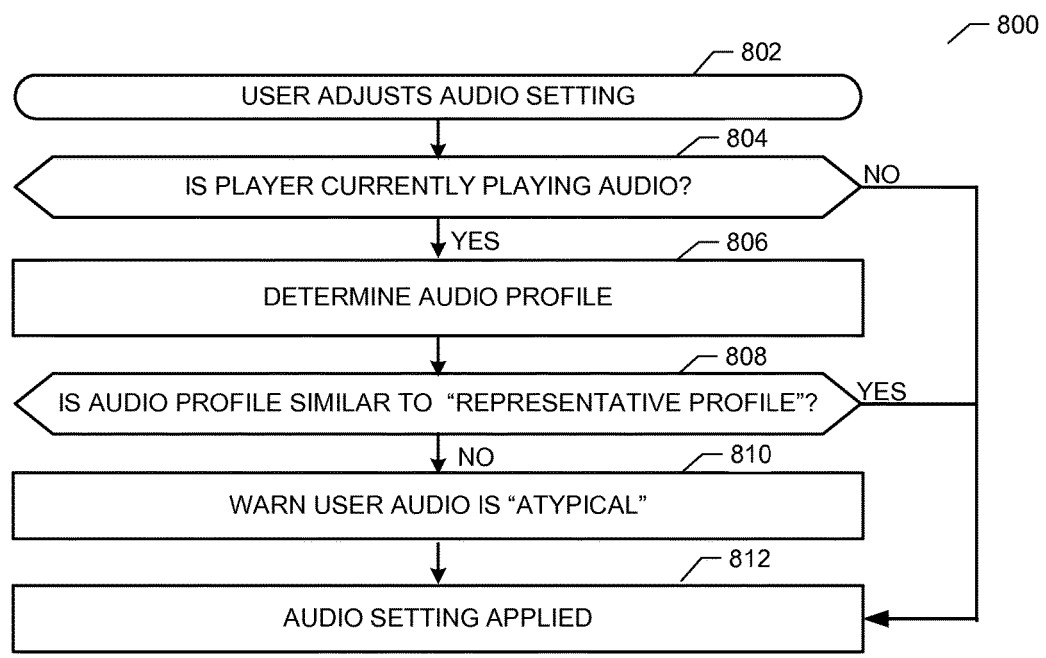
FIG. 8 shows an illustrative example flow diagram according to an embodiment.

FIG. 8 illustrates a flow diagram 800 of an example method to implement smart audio settings in a media playback system. At block 802, a user adjusts the audio settings of a playback device. For example, the user using a user interface on a controller 500 or zone player 400 may adjust the bass, treble, balance, loudness, and so on of a playback device, for example, while listening to a song or track over the playback device. Note that the audio setting adjustment may apply to a single playback device or a group of playback devices, and it is not required that audio be simultaneously (or substantially simultaneously) played while an audio setting is adjusted.

At block 804 a module determines if the playback device is currently playing audio. If the playback device is currently not playing audio, the audio setting is applied in block 812.

If the playback device is currently playing audio, then the audio profile is determined in block 806 for the currently playing audio.

At block 808, a module (e.g., a software/hardware module on a controller 500, on a playback device 400, and so on) compares the audio profile of the currently playing audio with a "representative profile." If the audio profile of the currently playing audio is similar (or substantially similar) to the "representative profile," then the audio setting is applied in block 812. Following the above example where an audio profile is determined by the percent spectral content in each of the five bins, the percent content per bin of the "representative profile" could be, for example, bin 1: 19-23%, bin 2: 28-33%, bin 3: 33-38%, bin 4: 8-13%, and bin 5: 2-8%. As long as the percent content per bin of the audio profile of the currently playing audio is within these percentages for each bin, for example, it is considered similar to the "representative profile."

If the audio profile of the currently playing audio is atypical, or not similar (or not substantially similar) to the "representative" audio profile, then an indication (e.g., warning message) is provided to the user in block 810 indicating the audio settings are being adjusted based on a song that is not representative of audio matching the profile. In block 812 the audio setting is applied.

Figure 9:
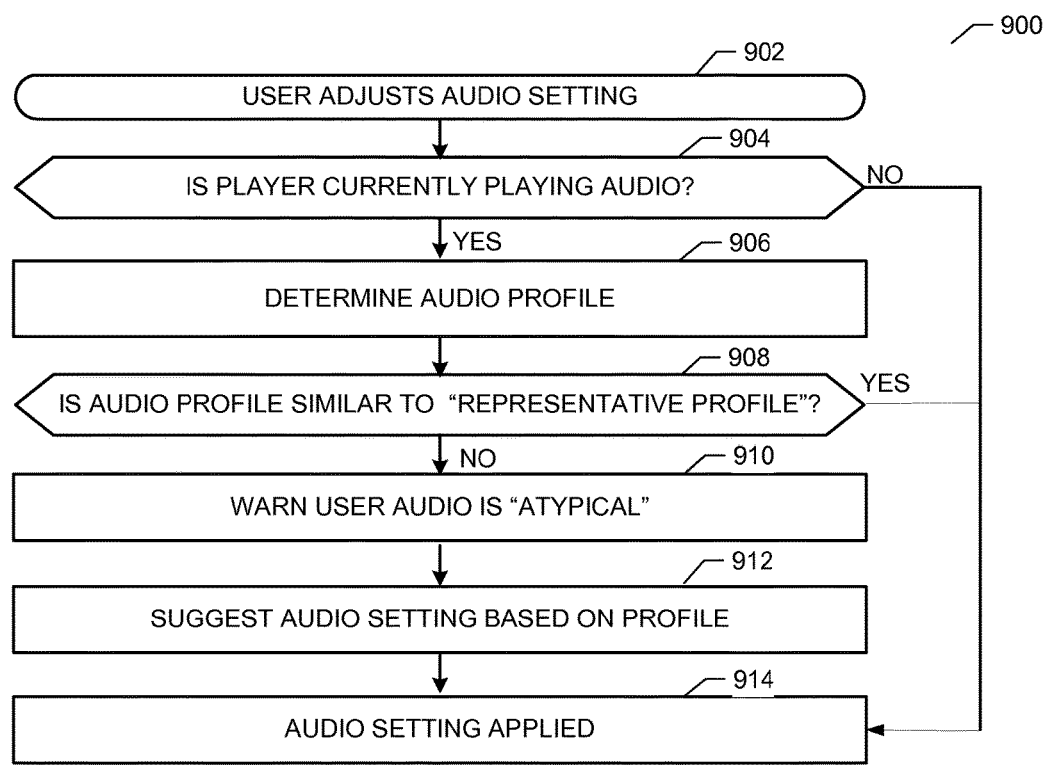
FIG. 9 illustrates a flow diagram of an example method where a system provides suggested audio settings based on a "representative profile;"

FIG. 9 illustrates a flow diagram 900 of an example method to implement smart audio settings in a media playback system where the system provides suggested settings based on the "representative profile." At block 902, a user adjusts the audio settings of a playback device. For example, the user using a user interface on a controller 500 or zone player 400 may adjust the bass, treble, balance, loudness, and so on of a playback device, for example, while listening to a song or track over the playback device. Note that the audio setting adjustment may apply to a single playback device or a group of playback devices, and it is not required that audio be simultaneously (or substantially simultaneously) played while an audio setting is adjusted.

At block 904 a module determines if the playback device is currently playing audio. If the playback device is currently not playing audio, the audio setting is applied in block 914.

If the playback device is currently playing audio, then the audio profile is determined in block 906 for the currently playing audio.

At block 908, a module (e.g., a software/hardware module on a controller 500, on a playback device 400, and so on) compares the audio profile of the currently playing audio with a "representative profile." If the audio profile of the currently playing audio is similar (or substantially similar) to the "representative profile," then the audio setting is applied in block 914.

If the audio profile of the currently playing audio is atypical, or not similar (or not substantially similar) to the "representative" audio profile, then an indication (e.g., warning message) is provided to the user in block 910 indicating the audio settings are being adjusted based on a song that is not representative of audio matching the profile. A suggested audio setting is provided in block 912 based on the "representative profile". The suggested audio setting may be, for example, a setting that takes into account additional information (e.g., user, playback device, group configuration, and so on).

In block 914 the audio setting is applied. The audio setting may be, for example, the setting applied by the user or the suggested setting provided in block 912.

Figure 10:
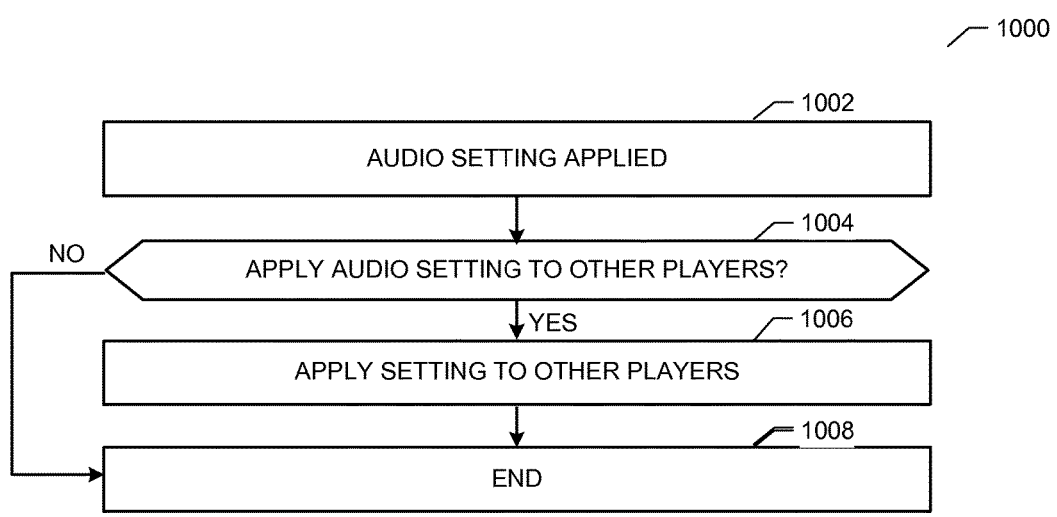
FIG. 10 illustrates a flow diagram of an example method to automatically replicate audio settings to other playback devices on the playback network.

FIG. 10 illustrates a flow diagram 1000 of an example method to implement smart audio settings in a media playback system where the audio settings are applied to other players in the playback system. In block 1002, an audio setting is applied to a playback device (e.g., playback device 400). In block 1004, a module (e.g., a software/hardware module on a controller 500, on a playback device 400, and so on) determines if the audio settings should be applied to other playback devices in the playback system. If the audio settings are to be applied to other playback devices in the playback network, then the settings are propagated and applied to the other devices. For example, if the audio settings are adjusted on a PLAY:3 device in a playback network, then the audio settings can be automatically replicated to all PLAY:3 devices on the playback network.

Figure 11:
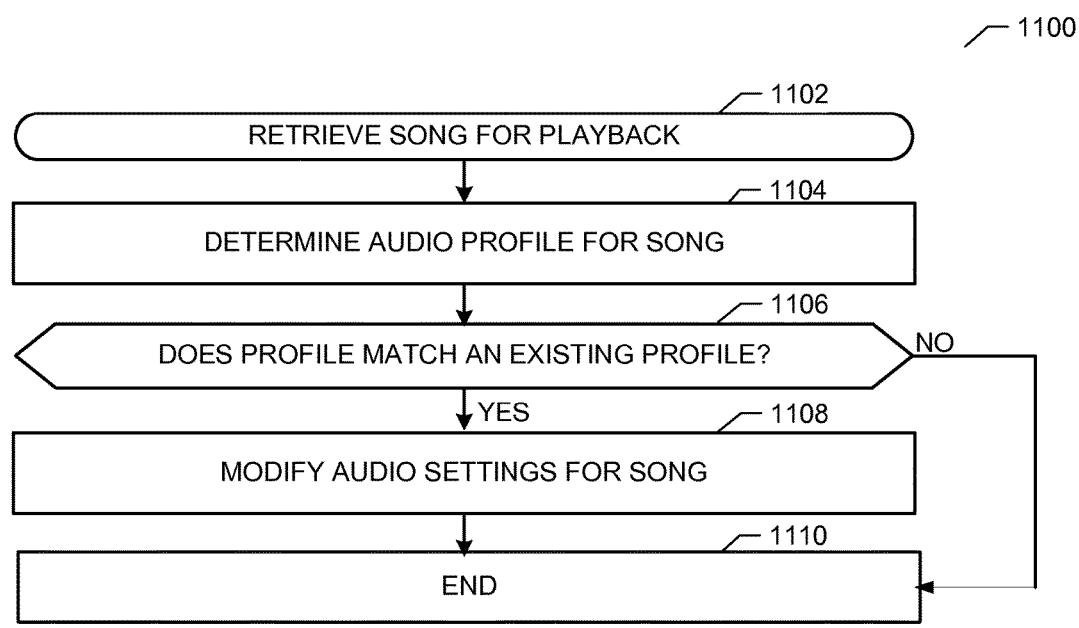
FIG. 11 illustrates a flow diagram of an example method to automatically adjust the audio settings based on an audio profile.

FIG. 11 illustrates a flow diagram 1100 of an example method to implement smart audio settings in a media playback system where the audio settings are automatically applied based on the audio profile of the song. In block 1102, the song to be played is retrieved. The song can be retrieved, for example, as a streaming file (e.g., Internet streaming audio) or it can be retrieved in portions or chunks. In block 1104, an audio profile is determined for the song. In block 1108, a module (e.g., a software/hardware module on a controller 500, on a playback device 400, and so on) compares the audio profile of the currently playing audio with a "representative profile." If the audio profile of the currently playing audio is similar (or substantially similar) to the "representative profile," then the audio setting is applied in block 1108 for the song. If the audio profile of the currently playing audio is atypical, or not similar (or not substantially similar) to the "representative" audio profile, then the audio profile is not automatically altered for the song.

VIII. Conclusion

In some embodiments, a first module determines an audio profile for a plurality of songs; a second module receives a user command to adjust the audio settings during playback of a song; a third module determines whether the currently playing song fits the audio profile; and if the song does not fit the audio profile, a fourth module provides an indication to the user prior to storing the audio setting adjustment.

In some embodiments, the modules reside in a playback device, a controller, a network enabled device on the local area network (LAN) or in the "cloud", or some combination thereof.

In some embodiments, the audio profile is based on the plurality of songs played over a time. In some embodiments, the audio profile is based on a genre. In some embodiments, the audio profile is based on audio played by a particular zone or group of zones.

In some embodiments the audio setting corresponding to a profile is stored.

In some embodiments, a determination is made that the song fits an audio profile and automatically adjusts the audio settings on a playback device based on the audio profile. In some embodiments, a determination is made that the song fits a different audio profile and automatically adjusts the audio settings on a playback device based on the different audio profile.

In some embodiments a first module receives a user command to adjust audio settings on a playback device; a second module determines if the audio settings are to be applied to other playback devices; and a third module propagates the audio settings to other playback devices.

The description discloses various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components can be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

Additionally, reference herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

I claim:

1. A first playback device comprising:
   a processor; and
   tangible, non-transitory computer-readable memory having stored thereon instructions executable by the processor, wherein the instructions, when executed, cause the first playback device to perform functions comprising:
   while the first playback device is a part of a first zone group that includes the first playback device and at least one second playback device, applying a first audio setting to at least one of the first playback device and the second playback device;
   joining a second zone group, the second zone group including the first playback device and at least one third playback device; and
   applying a second audio setting to at least one of the first playback device and the third playback device based on an audio content profile corresponding to the second zone group.

2. The first playback device of claim 1, wherein applying the second audio setting to at least one of the first playback device and the third playback device comprises:
   determining the audio content profile based on media content previously played by the first playback device as part of the second zone group; and
   applying the second audio setting to at least one of the first playback device and the third playback device based on the audio content profile for media content previously played by the first playback device as part of the second zone group.

3. The first playback device of claim 1, wherein applying the second audio setting to at least one of the first playback device and the third playback device comprises:
   identifying in a database, the second audio setting based on the audio content profile corresponding to the second zone group; and
   applying the identified second audio setting to at least one of the first playback device and the third playback device.

4. The first playback device of claim 1, wherein applying the first audio setting to at least one of the first playback device and the second playback device comprises:
   causing the first playback device and the at least one second playback device of the first zone group to apply the first audio setting.

5. The first playback device of claim 1, wherein applying the second audio setting to at least one of the first playback device and the third playback device comprises:
   causing the first playback device and the at least one third playback device to apply the second audio setting.

6. The first playback device of claim 1, wherein the functions further comprise:
   playing audio content as part of the second zone group; and
   updating the audio content profile based on the audio content being played by the first playback device as part of the second zone group.

7. The first playback device of claim 1, wherein the audio content profile is a first audio content profile, and wherein the functions further comprise:
   while playing audio content as part of the second zone group, receiving data indicating a command to adjust the second audio setting;
   identifying a second audio content profile for the audio content; and
   determining that the second audio content profile substantially matches the first audio content profile; and
   storing in a database, the adjusted second audio setting in association with the first audio content profile corresponding to the second zone group.

8. The first playback device of claim 1, wherein the audio content profile is a first audio content profile, and wherein the functions further comprise:
   while playing audio content as part of the second zone group, receiving data indicating a command to adjust the second audio setting;
   identifying a second audio content profile for the audio content;
   determining that the second audio content profile does not substantially match the first audio content profile; and
   transmitting a message indicating that the audio content is not representative of audio content previously played by the first playback device as part of the second zone group.

9. The first playback device of claim 1, wherein joining the second zone group comprises:
   receiving data indicating a command to join the second zone group; and
   responsively leaving the first zone group and joining the second zone group.

10. The first playback device of claim 1, wherein joining the second zone group comprises:
    receiving data indicating that a given second playback device of the first zone group has left the first zone group; and
    responsively leaving the first zone group and joining the second zone group.

11. The first playback device of claim 1, wherein joining the second zone group comprises:
    receiving data indicating that a fourth playback device has joined the first zone group; and
    responsively, leaving the first zone group and joining the second zone group.

12. A method comprising:
    while a first playback device is a part of a first zone group that includes the first playback device and at least one second playback device, applying, by the first playback device, a first audio setting to at least one of the first playback device and the second playback device;
    joining, by the first playback device, a second zone group, the second zone group including the first playback device and at least one third playback device; and
    applying to at least one of the first playback device and the third playback device, by the first playback device, a second audio setting based on an audio content profile corresponding to the second zone group.

13. The method of claim 12, wherein applying the second audio setting to at least one of the first playback device and the third playback device comprises:
    determining, by the first playback device, the audio content profile based on media content previously played by the first playback device as part of the second zone group; and
    applying to at least one of the first playback device and the third playback device, by the first playback device, the second audio setting based on the audio content profile for media content previously played by the first playback device as part of the second zone group.

14. The method of claim 12, wherein applying the second audio setting to at least one of the first playback device and the third playback device comprises:
    identifying, by the first playback device in a database, the second audio setting based on the audio content profile corresponding to the second zone group; and
    applying to at least one of the first playback device and the third playback device, by the first playback device, the identified second audio setting.

15. The method of claim 12, further comprising:
    playing, by the first playback device, audio content as part of the second zone group; and
    updating, by the first playback device, the audio content profile based on the audio content being played by the first playback device as part of the second zone group.

16. A tangible, non-transitory computer readable medium having stored thereon instructions executable by one or more processors, wherein the instructions, when executed, cause a first playback device to perform functions comprising:
    while the first playback device is a part of a first zone group that includes the first playback device and at least one second playback device, applying a first audio setting to at least one of the first playback device and the second playback device;
    joining a second zone group, the second zone group including the first playback device and at least one third playback device; and
    applying a second audio setting to at least one of the first playback device and the third playback device based on an audio content profile corresponding to the second zone group.

17. The tangible, non-transitory computer readable medium of claim 16, wherein applying the second audio setting to at least one of the first playback device and the third playback device comprises:
    determining the audio content profile based on media content previously played by the first playback device as part of the second zone group; and
    applying the second audio setting to at least one of the first playback device and the third playback device based on the audio content profile for media content previously played by the first playback device as part of the second zone group.

18. The tangible, non-transitory computer readable medium of claim 16, wherein applying the second audio setting to at least one of the first playback device and the third playback device comprises:
    identifying in a database, the second audio setting based on the audio content profile corresponding to the second zone group; and
    applying the identified second audio setting to at least one of the first playback device and the third playback device.

19. The tangible, non-transitory computer readable medium of claim 16, wherein the functions further comprise:
    playing audio content as part of the second zone group; and
    updating the audio content profile based on the audio content being played by the first playback device as part of the second zone group.

20. The tangible, non-transitory computer readable medium of claim 16, wherein the audio content profile is a first audio content profile, and wherein the functions further comprise:
    while playing audio content as part of the second zone group, receiving data indicating a command to adjust the second audio setting;
    identifying a second audio content profile for the audio content;
    determining that the second audio content profile substantially matches the first audio content profile; and storing in a database, the adjusted second audio setting in association with the first audio content profile corresponding to the second zone group.

* * * * *